United States Patent
Liu

(10) Patent No.: US 11,362,005 B2
(45) Date of Patent: Jun. 14, 2022

(54) SEMICONDUCTOR STRUCTURE AND FABRICATION METHOD

(71) Applicants: Semiconductor Manufacturing International (Shanghai) Corporation, Shanghai (CN); Semiconductor Manufacturing International (Beijing) Corporation, Beijing (CN)

(72) Inventor: Zhen Yu Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/421,756

(22) Filed: May 24, 2019

(65) Prior Publication Data

US 2019/0393101 A1    Dec. 26, 2019

(30) Foreign Application Priority Data

Jun. 25, 2018    (CN) .......................... 201810663579.8

(51) Int. Cl.
*H01L 21/8238* (2006.01)
*H01L 29/417* (2006.01)
*H01L 27/092* (2006.01)

(52) U.S. Cl.
CPC .... *H01L 21/823814* (2013.01); *H01L 27/092* (2013.01); *H01L 29/41725* (2013.01)

(58) Field of Classification Search
CPC ..... H01L 21/823878; H01L 21/823814; H01L 27/092; H01L 21/763; H01L 29/7848; H01L 29/7842; H01L 21/8238
See application file for complete search history.

(56) References Cited

U.S. PATENT DOCUMENTS

| | | | | |
|---|---|---|---|---|
| 6,368,926 B1* | 4/2002 | Wu | ................... | H01L 21/28035 438/300 |
| 2008/0191244 A1* | 8/2008 | Kim | ................ | H01L 21/823807 257/190 |
| 2012/0074468 A1* | 3/2012 | Yeh | ..................... | H01L 29/7848 257/255 |
| 2012/0168821 A1* | 7/2012 | Cheng | ............. | H01L 21/823814 257/192 |

(Continued)

*Primary Examiner* — Sarah K Salerno
(74) *Attorney, Agent, or Firm* — Anova Law Group, PLLC

(57) ABSTRACT

Semiconductor structures and fabrication methods are provided. An exemplary fabrication method includes providing a semiconductor substrate having a first region, a second region, a gate structure on the first region and a dummy gate structure on the second region, and an isolation structure in the semiconductor under the dummy gate structure. The method also includes forming source/drain openings in the semiconductor substrate at two sides of the gate structure. A sidewall surface of the source/drain opening contains an apex angle extending into the semiconductor substrate under the gate structure; and the source/drain opening exposes a sidewall surface of the isolation structure. Further, the method includes forming an initial bulk layer in the source/drain opening; performing a reshaping process to the initial bulk layer to form a bulk layer having an a substantially flat reshaped surface; and forming a protective layer on the bulk layer.

16 Claims, 3 Drawing Sheets

(56) References Cited

U.S. PATENT DOCUMENTS

| | | | |
|---|---|---|---|
| 2013/0082309 A1* | 4/2013 | Su | H01L 29/7848 257/288 |
| 2013/0240956 A1* | 9/2013 | Hou | H01L 29/78 257/288 |
| 2013/0252392 A1* | 9/2013 | Cheng | H01L 21/02661 438/300 |
| 2015/0021696 A1* | 1/2015 | Sung | H01L 29/165 257/368 |

* cited by examiner

SEMICONDUCTOR STRUCTURE AND FABRICATION METHOD

CROSS-REFERENCES TO RELATED APPLICATIONS

This application claims the priority of Chinese patent application No. 201810663579.8, filed on Jun. 25, 2018, the entirety of which is incorporated herein by reference.

FIELD OF THE DISCLOSURE

The present disclosure generally relates to the field of semiconductor manufacturing and, more particularly, relates to semiconductor structures and fabrication methods.

BACKGROUND

With the rapid development of semiconductor manufacturing technologies, semiconductor devices have been developed toward higher device density and higher integration level to achieve higher computing speed, larger data storage capacity, and more functions. The gate of the complementary metal oxide semiconductor (CMOS) transistor has become thinner and shorter; and the length has become shorter than ever. To obtain better electrical properties, it is often necessary to improve the performance of the semiconductor devices by controlling the carrier mobility of the channel regions of the semiconductor devices. A key element in controlling the carrier mobility is to control the stress in the channel region of the transistor to increase the drive current.

Current, the embedded silicon germanium (Embedded SiGe) technology is often used to increase the stress. In particular, silicon germanium is first formed in the regions where a source region and a drain region are required to be formed, and then silicon germanium is doped to form the source region and the drain region of the PMOS transistor. Silicon germanium is used to introduce a compressive stress formed by the lattice mismatch between silicon and silicon germanium to control the carrier mobility. Accordingly, the performance of the PMOS transistor is improved.

However, it is desirable to further improve the performance of the PMOS transistors. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate having a first region and a second region. A gate structure is formed on a surface of the first region of the semiconductor substrate; a dummy gate structure is formed a surface of the second region of the semiconductor substrate; and an isolation structure is formed in the semiconductor substrate under the dummy gate structure. The method also includes forming a source/drain opening in the semiconductor substrate at each of the two sides of the gate structure. A sidewall surface of the source/drain opening contains an apex angle; the apex angle extends into the semiconductor substrate under the gate structure; and the source/drain opening exposes a sidewall surface of the isolation structure. Further, the method includes forming an initial bulk layer in the source/drain opening. A top surface of the initial bulk layer and a sidewall surface of the bulk layer adjacent to the isolation structure are exposed. Further, the method includes performing a reshaping process to the initial bulk layer to form a bulk layer having a substantially flat reshaped surface; and forming a protective layer on the bulk layer.

Another aspect of the present disclosure includes a semiconductor structure. The semiconductor structure includes a semiconductor substrate having a first region and a second region. A surface of the first region of the semiconductor substrate contains a gate structure; and a surface of the second region of the semiconductor substrate contains a dummy gate structure; and the semiconductor substrate under the dummy gate structure contains an isolation structure. The semiconductor structure also includes a bulk layer having a substantially flat reshaped surface formed in the semiconductor substrate at each of two sides of the gate structure; and a protective layer formed on the reshaped surface of the bulk layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
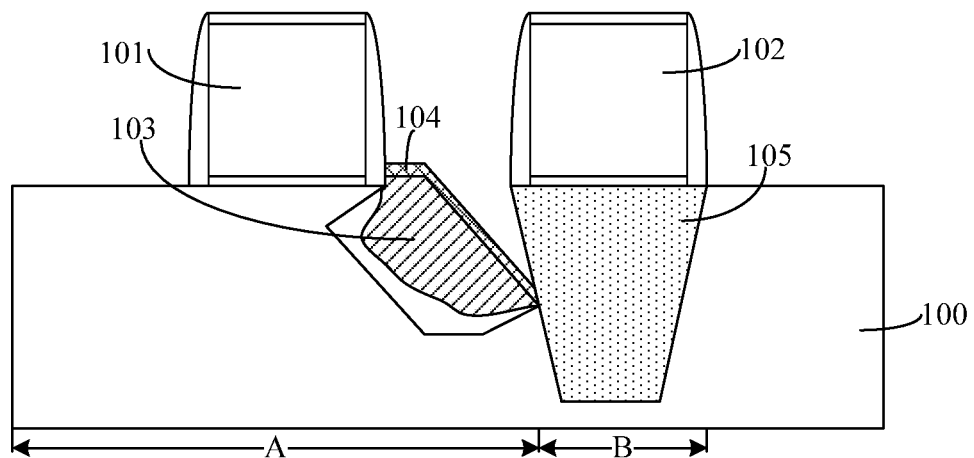
FIG. 1 illustrates a semiconductor structure.

FIG. 1 illustrates a semiconductor structure. As shown in FIG. 1, the semiconductor structure includes a semiconductor substrate 100. The semiconductor substrate 100 includes a first region A and a second region B. The surface of the first region A of the semiconductor substrate 100 has a gate structure 101, and the surface of the second region B of the semiconductor substrate 100 has a dummy gate structure 102. The dummy gate structure 102 and the gate structure 101 are arranged in parallel. The semiconductor substrate 100 under the bottom of the dummy gate structure 102 has an isolation structure 105. The semiconductor structure also includes a source/drain opening (not labeled) in the semiconductor substrate 100 at each of two sides of the gate structure 101. The sidewall surfaces of the source/drain openings have apex angles (not labeled). The apex angles extend toward the semiconductor substrate 100 under the bottom of the gate structure 101. The source/drain openings expose the isolation structure 105. Further, the semiconductor structure includes a bulk layer 103 formed in the source/drain opening. A top portion of the bulk layer 103 and a sidewall surface of the bulk layer 103 adjacent to the isolation structure 105 are exposed between the gate structure 101 and the isolation structure 105. Further, the semiconductor includes a protective layer 104 formed on the top surface and the sidewall surface of the bulk layer 103.

In such a semiconductor structure, because the source/drain opening exposes the sidewall surface of the isolation structure 105, and the isolation structure 105 cannot be used for the subsequent growth of the bulk layer 103, the top surface of the bulk layer 103 formed in the source/drain opening and the sidewall surface bulk layer adjacent to the isolation structure 105 are exposed. The crystal orientation of the top surface of the bulk layer 103 is different from the crystal orientation of the sidewall surface of the bulk layer 103 adjacent to the isolation structure 105. In particular, the crystal orientation of the top surface of the bulk layer 103 is <100>, and the crystal orientation of the sidewall surface of the bulk layer 103 adjacent to the isolation structure 105 is <111>. The material of the protective layer 104 includes boron doped silicon, and the formation process of the protective layer 104 includes an epitaxial growth process. Generally, the growth rate along the <100> crystal orientation by the epitaxial growth process is greater than the growth rate along the <111> crystal orientation. When the portion of the protective layer 104 on the top surface of the bulk layer 103 is substantially thick, the portion of the bulk layer 103 on the sidewall surface of the protective layer 104 adjacent to the isolation structure 105 is substantially thin.

After forming the protective layer 103, the method further includes forming a dielectric layer on the top surfaces of the semiconductor substrate 100 and the protective layer 103, the sidewall surface and the top surface of the gate structure 101, and the sidewall surface and the top surface of the dummy gate structure 102. Then, a portion of the dielectric layer is removed until the protective layer 104 is exposed, and contact holes are formed in the dielectric layer. In the process for forming the contact holes, because the portion of the protective layer 104 on the sidewall surface of the bulk layer 103 adjacent to the isolation structure 105 may be substantially thin, the portion of the protective layer 104 on the sidewall surface of the bulk layer 103 adjacent to the isolation structure 105 is easily punched-through, or even removed. The stress of the bulk layer 103 is proportional to the volume of the bulk layer 103. When the volume of the bulk layer 103 is substantially small, the stress of the bulk layer 103 is also substantially small. Thus, the effect for increasing the carrier mobility of the channel region is adversely affected.

Further, after forming the contact holes, before forming the conductive plugs, the method includes forming a metal silicide layer on the bottom of the contact holes. If the contact holes are etched through the protective layer 104 and into the bulk layer 103, the metal silicide layer is formed on the top surface of the bulk layer 103. Taking a PMOS transistor as an example, to increase the carrier mobility of the channel region of the PMOS transistor, the material of the bulk layer 103 is made of silicon germanium, and the germanium ions are semiconductor ions. Thus, the germanium ions increase the resistance of the metal silicide layer; and the contact resistance between the contact plug and the bulk layer 103 is substantially high. Correspondingly, the contact resistance between the contact plug and the bulk layer in the PMOS transistor is also substantially large. Thus, it does not facilitate to improve the electrical performance of the semiconductor device.

Figure 2:
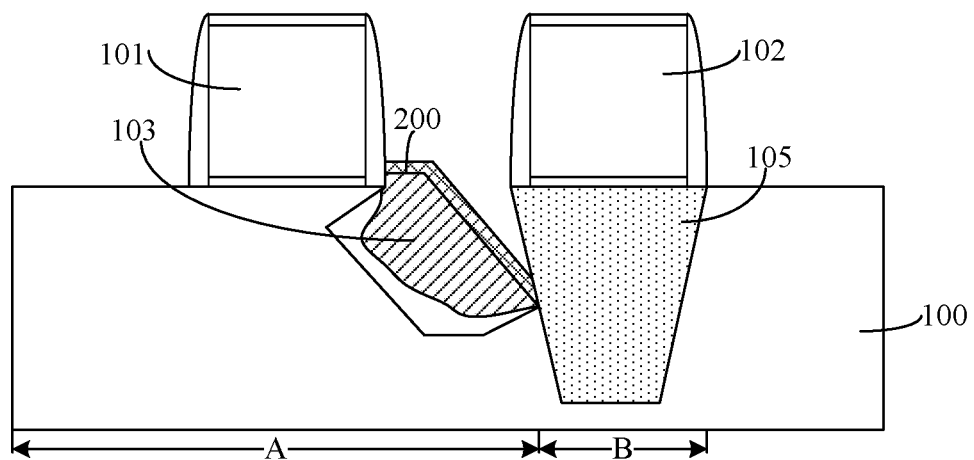
FIG. 2 illustrates another semiconductor structure.

To increase the thickness of the protective layer 104 on the sidewall surface of the bulk layer 103 adjacent to the isolation structure 105, a new method is proposed. FIG. 2 illustrates a semiconductor device.

As shown in FIG. 2, the major difference between FIG. 2 and FIG. 1 includes that the method for forming the protective layer 200 includes a plurality of balancing processes, and each balancing process includes forming a protective material film and removing a portion of the protective material film. The thickness of the portion of the protective material film on the top of the bulk layer 103 is greater than the thickness of the portion of the protective material film on the sidewall surface of the bulk layer 103 adjacent to the isolation structure 105. Further, the rate for removing the portion of the protective film on the top surface of the bulk layer 103 is greater than the rate for removing the portion of the protective film on the sidewall surface of the bulk layer 103 adjacent to the isolation structure 105.

In such a method, each balancing process removes a top portion of the protective film on the bulk layer 103 such that the protective material film on the top surface of the bulk layer 103 is not too thick. Further, the removing rate of each balancing process to the portion of the protective material film on the sidewall surface of the bulk layer 103 adjacent to the isolation structure 105 is substantially slow. Thus, the thickness of the remaining portion of the protective material film on the sidewall surface of the bulk layer 103 adjacent to the isolation structure 105 is substantially thick after each balancing process. After several balancing processes, the portion of the protective material layer on the sidewall surface of the bulk layer 103 adjacent to the isolation structure 105 is substantially thick. At the same time, the thickness of the portion of the protective material layer on the top surface of the bulk layer 103 is not excessively thick. However, such a method has many process steps, and the process control is difficult.

The present disclosure provides a semiconductor structure and a method for forming a semiconductor structure. The method may include forming an initial bulk layer in the source/drain openings, respectively. The top surface of the initial bulk layer and sidewall surface of the initial bulk layer may be exposed between the gate structure and the isolation structure. The method may also include reshaping the initial bulk layer to form a bulk layer. The bulk layer may include an exposed reshaped surface. The reshaped surface may be substantially flat. Then, a protective layer may be formed on the surface of the bulk layer. The semiconductor device formed by the disclosed method may have an improved performance.

Figure 5:
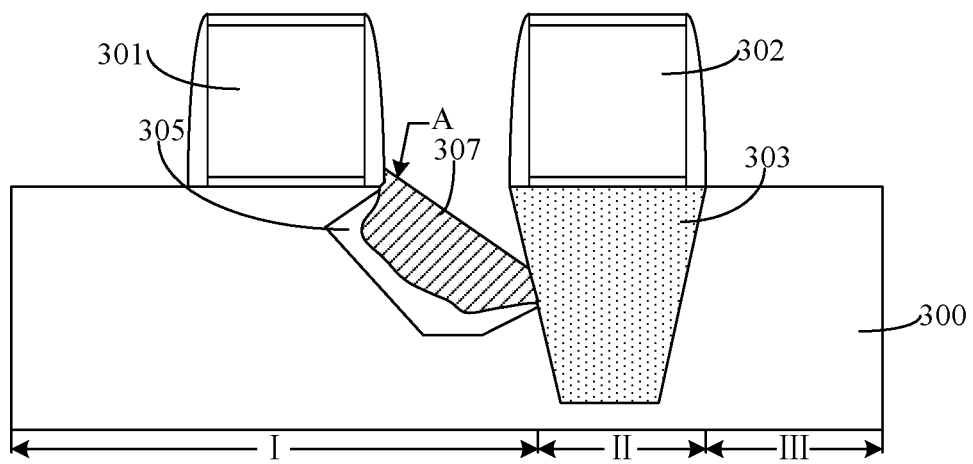
Figure 6:
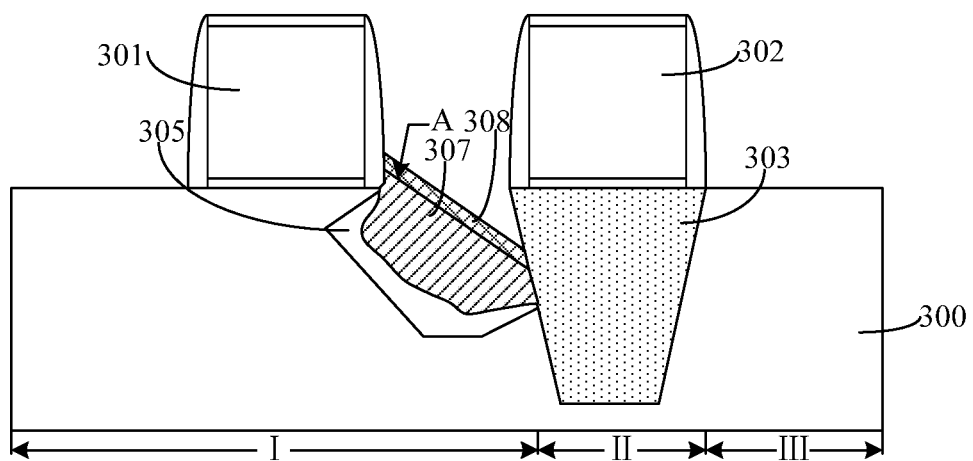
Figure 7:
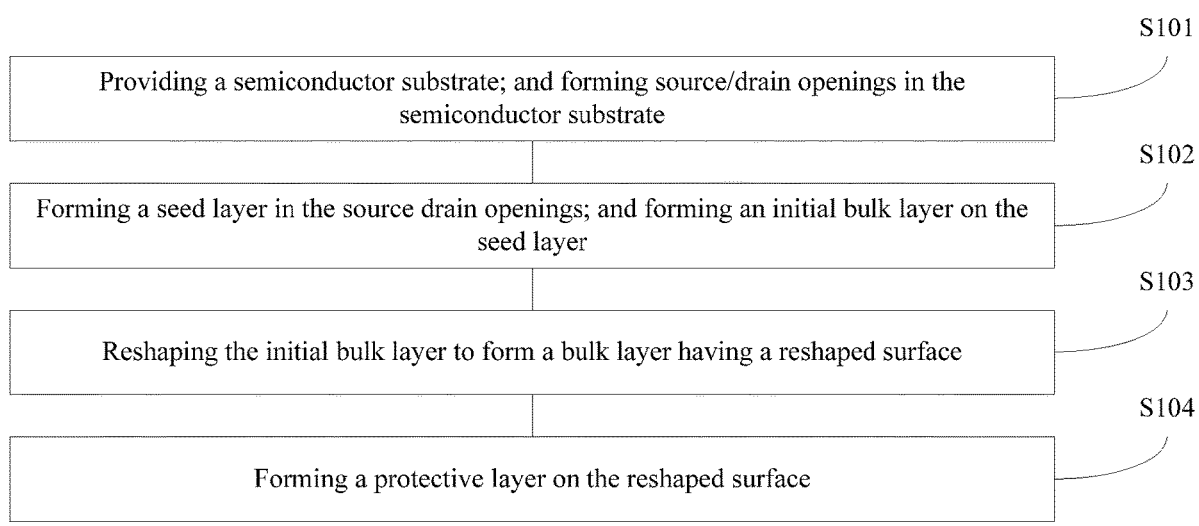
FIG. 7 illustrates an exemplary fabrication process of a semiconductor structure consistent with various disclosed embodiments.

FIG. 7 illustrates an exemplary fabrication method of a semiconductor structure consistent with various disclosed embodiments. FIGS. 3-6 illustrate structures corresponding to certain steps during the exemplary fabrication method of a semiconductor structure consistent with various disclosed embodiments.

Figure 3:
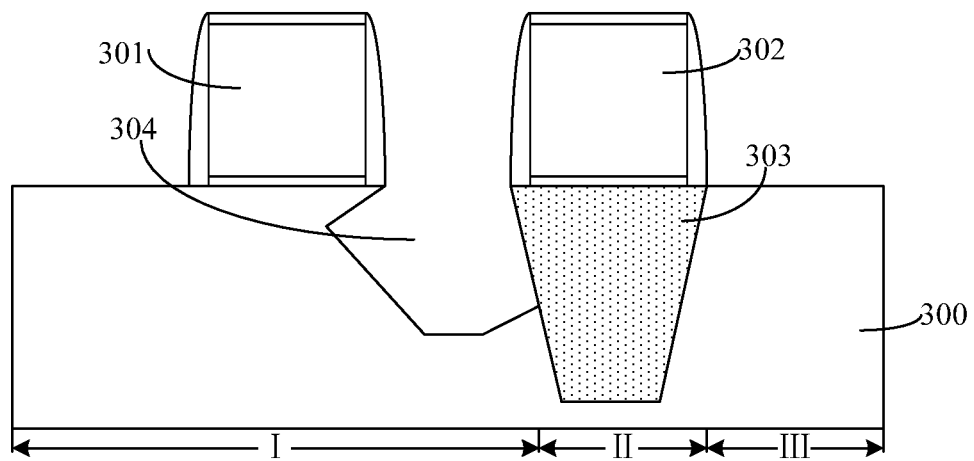
FIGS. 3-6 illustrate structures corresponding to certain stages during an exemplary fabrication process of a semiconductor structure consistent with various disclosed embodiments.

As shown in FIG. 7, at the beginning of the fabrication process, a semiconductor substrate with certain structures is provided (S101). FIG. 3 illustrates a corresponding semiconductor structure.

As shown in FIG. 3, a semiconductor substrate 300 is provided. The semiconductor substrate 300 may include a first region I and a second region II. The surface of the first region I of the semiconductor substrate 300 may have a gate structure 301, and the surface of the second region II of the semiconductor substrate 300 may have a dummy gate structure 302. In particular, the gate structure 301 may be formed on the surface of the first region I of the semiconductor substrate 300, and the dummy gate structure 302 may be formed the surface of the second region II of the semiconductor substrate 300.

Further, an isolation structure 303 may be formed in the semiconductor substrate 200 under the bottom of the dummy gate structure 302. A source/drain opening 304 may be formed in the semiconductor substrate 300 at each of the two sides of the gate structure 301. The sidewall surface of the source/drain opening 304 may have an apex angle (not labeled). The apex angle may extend into the semiconductor substrate 300 under the bottom of the gate structure 301. The source/drain opening 304 may expose the isolation structure 303.

The first region I may be used to form a PMOS transistor, and the second region II may be used to form the isolation structure 303. The semiconductor substrate 300 may also include a third region III. The first region I and the third region III may be respectively located at two sides of the second region II. The third region III may be used to form an NMOS transistor or a PMOS transistor. The isolation structure 303 may be used to electrically isolate the device (s) in the first region I and the device (s) in the third region III.

In one embodiment, the semiconductor substrate 300 is a planar substrate. In some embodiments, the semiconductor substrate may include a base substrate and at least one fin on the base substrate.

In one embodiment, the semiconductor substrate 300 is made of silicon. In some embodiments, the semiconductor substrate may be made of germanium, silicon germanium, silicon on insulator (SOI), or germanium on insulator (GOI), etc.

The isolation structure 303 may be made of silicon oxide, etc. The isolation structure 303 may not be used to subsequently form an initial bulk layer. In particular, the initial bulk layer may not grow on the isolation structure 303. Thus, the top surface of the initial bulk layer formed in the source/drain opening 304 and the sidewall surface of the initial bulk layer adjacent to the isolation structure 303 may be exposed.

The gate structure 301 and the dummy gate structure 302 may all include a gate dielectric layer (not labeled) and a gate layer (not labeled) formed on the surface of the gate dielectric layer.

The gate dielectric layer may be made of silicon oxide. The gate layer may be made of silicon.

The method for forming the source/drain openings 304 may include forming an initial source/drain opening in the semiconductor substrate 300 at each of the two sides of the gate structure 301 by an etching process using the gate structure 301, the dummy gate structure 302, and the isolation structure 303 as a mask. The sidewall surfaces of the initial source/drain openings may be perpendicular to the bottoms of the initial source/drain openings. Then, portions of the semiconductor substrate 300 on the sidewall surfaces of the initial source/drain openings and the bottom surfaces of the initial source/drain openings may be removed to form the source/drain openings 304.

The process for forming the initial source/drain openings may include a dry etching process.

The process for removing the portions of the semiconductor substrate 300 on the sidewall surfaces of the initial source/drain openings and the bottom surfaces of the initial source/drain openings may include a wet etching process. The wet etching process may use a certain etchant. In the wet etching process, the etching rate of the etchant to the semiconductor substrate 300 may be substantially large, and the etching rate of the etchant to the isolation structure 303 may be substantially small. Thus, the " " shape of the source/drain opening 304 may be incomplete.

The source/drain openings 304 may be used to subsequently accommodate a seed layer and a bulk layer on the top of the seed layer. In particular, the seed layer may be subsequently formed the source/drain openings 304, and the bulk layer may be formed on the seed layer.

Figure 4:
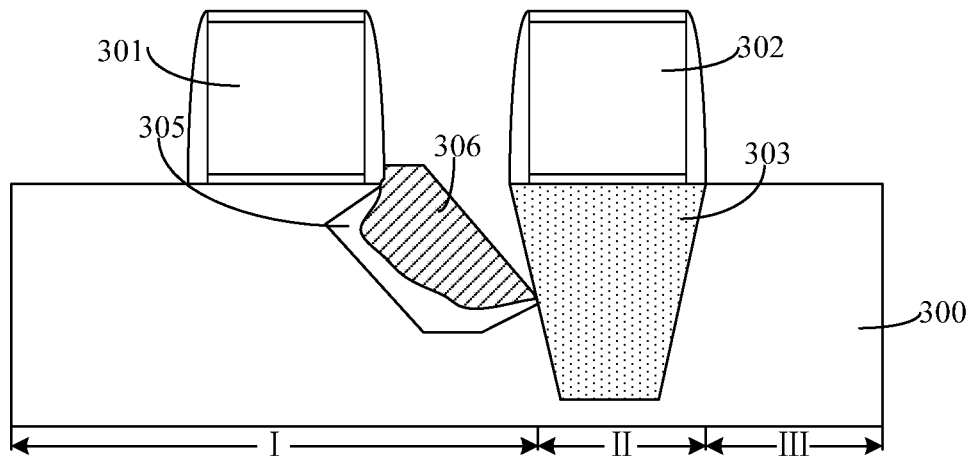

Returning to FIG. 7, after forming the source/drain openings, a seed layer may be formed in the source/drain openings; and an initial bulk layer may be formed on the seed layer (S102). FIG. 4 illustrates a corresponding semiconductor structure.

As shown in FIG. 4, a seed layer 305 is formed in the source/drain opening 304 (referring to FIG. 3); and an initial bulk layer 306 may be formed on the surface of the seed layer 305. The top surface of the initial bulk layer 306 and the sidewall surface of the initial bulk layer 306 adjacent to the isolation structure 303 may be exposed between the gate structure 301 and the isolation structure 303.

The seed layer 305 may be made of any appropriate material. In one embodiment, the seed layer 305 is made of silicon germanium. Various processes may be used to form the seed layer 305. In one embodiment, an epitaxial growth process is used to form the seed layer 305.

The seed layer 305 may prevent the stress from releasing from the subsequently formed initial bulk layer 306.

The initial bulk layer 306 may be made of any appropriate material. In one embodiment, the initial bulk layer 306 is made of silicon germanium. Silicon germanium may be able to generate a compressive stress on the channel region of the semiconductor structure. Thus, the carrier mobility of the channel region may be increased.

Various processes may be used to form the initial bulk layer 306. In one embodiment, the initial bulk layer 306 is formed by an epitaxial growth process.

During the epitaxial growth process, because the initial bulk layer 306 may not be grown on the isolation structure 303, the top surface of the initial bulk layer 306 and the sidewall surface of the initial bulk layer 306 adjacent to the isolation structure 303 may be exposed. The crystal orientation of the top surface of the initial bulk layer 306 and the crystal orientation of the sidewall surface of the initial bulk layer 306 adjacent to the isolation structure 303 may be different. In particular, the crystal orientation of the top surface of the initial bulk layer 306 may be <100>, and the crystal orientation of the sidewall surface of the initial bulk layer 306 adjacent to the isolation structure 303 may be <111>. Generally, the growth rate on the crystal orientation <100> is greater than the growth rate on the crystal orientation <111>.

Returning to FIG. 7, after forming the initial bulk layer, the initial bulk layer may be reshaped to form a bulk layer (S103). FIG. 5 illustrates a corresponding semiconductor structure.

As shown in FIG. 5, the initial bulk layer 306 may be reshaped to form a bulk layer 307. The bulk layer 307 may have an exposed reshaped surface A. The reshaped surface A may be substantially flat.

The process for reshaping the initial bulk layer 306, i.e., a reshaping process, may be a high temperature baking process performed in the chamber of the epitaxial growth process. The carrier gas of the high temperature baking process may include hydrogen or nitrogen, etc. The temperature of the high temperature baking process may be in a range of approximately 780° C.-820° C. The time of the high temperature baking process may be in a range of approximately 15 seconds-60 seconds.

The mechanism of the reshaping process may include that, under the driving of the high temperature of the reshaping process, the crystal lattice of the initial bulk layer 304 may be rearranged, and after a period of time, an equilibrium state may be formed. In particular, the bulk layer 307 may be formed; and the reshaped surface A of the bulk layer 307 may be substantially flat.

The reshaped surface A may be used for subsequently depositing a protective layer. The reshaped surface A may have a same crystal orientation. Thus, the thickness of the subsequently formed protective layer may be the same, and the protective layer may be substantially thick by controlling the process for forming the protective layer. Accordingly, the protective ability of the protective layer to the bulk layer 307 may be substantially strong, and the subsequently formed contact holes may be not easy to penetrate through the protective layer to be located in the bulk layer 307. In particular, without reducing the volume of the bulk layer 307 by the contact holes, the volume of the bulk layer 307 may be substantially large. Accordingly, the bulk layer 307 may have a substantially large stress, and the carrier mobility of the channel region of the semiconductor structure may be increased.

The reshaped surface A may have a same crystal orientation. Thus, the thickness of the subsequently formed protective layer may be the same, and the protective layer may be substantially thick by controlling the process for forming the protective layer. Accordingly, the protective ability of the protective layer to the bulk layer 307 may be substantially strong, and the subsequently formed contact holes may be not easy to be etched to pass through the protective layer to be located in the bulk layer 307. In particular, the volume of the bulk layer 307 may be substantially large without being reduced by the contact holes. Accordingly, the bulk layer 307 may have a substantially large stress, and the carrier mobility of the channel region of the semiconductor structure may be increased.

The substantially flat surface of the reshaped surface A may allow the growth rate of the protective layer subsequently formed on the reshaped surface A to be all the same. Accordingly, by controlling the process for forming the protective layer, the protective layer may be substantially thick. Thus, the protective ability of the protective layer to the bulk layer 307 may be substantially strong during the process for forming the contact holes; and the subsequently formed contact holes may not be located in the bulk layer 307. In particular, the volume of the bulk layer 307 may not be consumed. The stress of the bulk layer 307 may be proportional to the volume of the bulk layer 307. When the volume of the bulk layer 307 is substantially large, the stress of the bulk layer 307 may also be substantially large. Accordingly, the carrier mobility of the channel region of the semiconductor structure may be increased.

Further, when the temperature of the high temperature baking process is less than 780° C., the lattice rearrangement in the initial bulk layer 306 may be insufficient. Thus, the crystal orientation <111> may still present, and the growth rate in the crystal orientation <111> may be still substantially slow. Accordingly, the protective layer formed along the crystal orientation <111> may be still substantially thin, and the subsequent formed contact holes may easily penetrate through the protective layer to be located in the bulk layer 307. In particular, a portion of the bulk layer 307 may be etched away and the volume of the bulk layer 307 may be reduced. The volume of the bulk layer 307 may be proportional to the stress of the bulk layer 307. When the volume of the bulk layer 307 is reduced, the stress of the bulk layer 307 may also be reduced, which may not facilitate to increase the carrier mobility in the channel region. When the temperature is greater than 820° C., the stress in the bulk layer 307 may be released, and the bulk layer 307 may have less stress on the channel region, and the carrier mobility of in the channel may be substantially low.

When the time of the high temperature baking process is less than 15 seconds, the lattice rearrangement in the initial bulk layer 306 may be insufficient. Thus, the crystal orientation <111> may still present, and the growth rate in the crystal orientation <111> may be still substantially slow. Accordingly, the protective layer formed along the crystal orientation <111> may be still substantially thin, and the subsequent formed contact holes may easily penetrate through the protective layer to be located in the bulk layer 307. In particular, a portion of the bulk layer 307 may be etched away and the volume of the bulk layer 307 may be reduced. The volume of the bulk layer 307 may be proportional to the stress of the bulk layer 307. When the volume of the bulk layer 307 is reduced, the stress of the bulk layer 307 may also be reduced, which may not facilitate to increase the carrier mobility in the channel region. When the temperature is greater than 820° C., the stress in the bulk layer 307 may be released, and the bulk layer 307 may have less stress on the channel region, and the carrier mobility of in the channel may be substantially low.

When the carrier gas of the high temperature baking process is hydrogen, because hydrogen is a reducing gas, during the reshaping process, hydrogen may not easily react with the exposed portions of the semiconductor structure. Thus, hydrogen may not easily cause additional contaminations to the semiconductor structure. Moreover, the exposed portions of the substrate 300 in the air may be easily oxidized into silicon oxide. The hydrogen gas may reduce the silicon oxide into silicon. Thus, the performance of the semiconductor structure may be improved.

Returning to FIG. 7, after reshaping the initial bulk layer to form the bulk layer, a protective layer may be formed on the reshaped surface (S104). FIG. 6 illustrates a corresponding semiconductor structure.

As shown in FIG. 6, a protective layer 308 is formed on the reshaped surface A of the bulk layer 307.

The protective layer 308 may be made of any appropriate material. In one embodiment, the protective layer 308 is made of boron doped silicon.

Various processes may be used to form the protective layer 308. In one embodiment, the protective layer 308 is formed by an epitaxial growth process.

The thickness of the protective layer may be any appropriate value. In one embodiment, the thickness of the protective layer 308 may be in a range of approximately 10 nm to 20 nm.

Because the crystal orientation of the reshaped surface A may be the same, the growth rate of the protective layer 308 on the reshaped surface A may be substantially the same. By controlling the growth time, the thickness of the protective layer 308 may be substantially large. Thus, the subsequently formed contact holes may not be located in the bulk layer 307. In particular, the volume of the bulk layer 307 may not be consumed, and the volume of the bulk layer 307 may be still substantially large. Thus, the stress of the bulk layer 307 may be substantially large, and the carrier mobility of the channel region may be increased.

After forming the protective layer 308, the method may include forming a dielectric layer on the semiconductor substrate, the sidewall surfaces and the top surface of the gate structure, the sidewall surfaces and the top surface of the dummy gate structure, and the exposed surface of the protective layer; removing portions of the dielectric layer until the protective layer is exposed to form contact holes in the dielectric layer; forming a metal silicide layer on the top surface of the protective layer at the bottoms of the contact holes; and forming a conductive plug on the surface of the metal silicide layer by filling the contact holes.

The method for forming the metal silicide layer may include forming a metal layer; and performing an annealing process to cause the metal layer to react with a portion of the protective layer to form the metal silicide layer.

The metal layer may be made of any appropriate material, such as titanium, or nickel, etc. The protective layer 308 may be made of any appropriate material. In one embodiment, the protective layer 308 is made of boron doped silicon.

When the contact holes do not pass through the protective layer 308, the protective layer 308 may protect the top surface of the bulk layer 307. Accordingly, although the bulk layer 307 may contain silicon germanium ions, the silicon germanium ions may not affect the resistance of the metal silicide layer. Further, the metal silicide layer formed by the reaction of the protective layer 308 and the metal layer may have a substantially low electrical resistance. Thus, the contact resistance between the conductive plugs and the bulk layer 307 may be reduced.

The present disclosure also provides a semiconductor structure. FIG. 6 illustrates an exemplary semiconductor structure consistent with various disclosed embodiments.

As shown in FIG. 6, the semiconductor structure may include a semiconductor substrate 300 having a first region I and a second region II. The surface of the first region I of the semiconductor substrate 300 may have a gate structure 301, and the surface of the second region II of the semiconductor substrate 300 may have a dummy gate structure 302. The semiconductor substrate 300 under the bottom of the gate structure 302 may have an isolation structure 303.

Further, referring to FIG. 3 the semiconductor structure may include a source/drain opening 304 (see FIG. 3) located in the semiconductor substrate 300 at each of two sides of the gate structure 301. The sidewall surface of the source/drain opening 304 may have an apex angle, and the apex angle may extend into the semiconductor substrate 300 under the bottom of the gate structure 301, and the source/drain opening 304 may expose a sidewall surface of the isolation structure 303.

Further, the semiconductor structure may include a bulk layer 307 formed within the source/drain opening 304. The bulk layer 307 may have an exposed reshaped surface A. The reshaped surface A may be substantially flat.

Further, the semiconductor structure may include a protective layer 308 formed on the reshaped surface A.

The semiconductor substrate 300 may be made of silicon, etc. The isolation structure 303 may be made of silicon oxide.

The protective layer 308 may be made of boron doped silicon, etc. The thickness of the protective layer 308 may be in a range of approximately 10 nm to 20 nm.

The semiconductor structure may also include a dielectric layer formed on the surfaces of the semiconductor substrate 300 and the protective layer 308, the sidewall surfaces and the top surface of the gate structure 301, and the sidewall surfaces and the top surface of the dummy gate structure 302. Further, the semiconductor structure may include contact holes formed in the dielectric layer. The bottom of the contact hole may expose a top surface of the protective layer 308. Further, the semiconductor structure may include a metal silicide layer formed on the protective layer 308 exposed by the bottom of the contact hole; and a conductive plug formed on the metal silicide layer. The conductive plug may fill the contact hole. The detailed structures and intermediate structures are described above with respect to the fabrication processes.

In the disclosed method for fabricating a semiconductor structure, the source/drain openings may expose the isolation structure, and the surface of the isolation structure may not be used to grow the initial bulk layer. Thus, the top surface of the initial bulk layer and the sidewall surface of the initial bulk layer adjacent to the isolation structure may be exposed. During the subsequent reshaping process, the crystal lattice of the initial bulk layer may be rearranged and reach to an equilibrium status to form the bulk layer. In particular, the reshaped surface of the bulk layer may be substantially flat. Because the reshaped surface of the bulk layer may be substantially flat, the thickness of the subsequently formed protective layer may be substantially uniform. By controlling the fabrication process to cause the protective layer to have a substantially large thickness, the protective layer may have a desired protection ability to the bulk layer during subsequently forming the contact holes; and the contact holes may not penetrate into the bulk layer. In particular, the bulk layer may not be consumed during the process for forming the contact holes. The stress of the bulk layer may be proportional to the volume of the bulk layer. Thus, when the volume of the bulk layer is substantially large, the stress of the bulk layer may also be substantially large. Accordingly, the carrier mobility of the channel region of the semiconductor structure may be increased. Further, the fabrication process of the semiconductor structure may be substantially simple.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:

providing a semiconductor substrate having a first region and a second region, wherein a gate structure is formed on a surface of the first region of the semiconductor substrate, a dummy gate structure is formed on a surface of the second region of the semiconductor substrate, and an isolation structure is formed in the semiconductor under the dummy gate structure;

forming a source/drain opening in the semiconductor substrate at each side of the gate structure, wherein a sidewall surface of the source/drain opening contains an apex angle, the apex angle extends into the semiconductor substrate under the gate structure, and the source/drain opening exposes a sidewall surface of the isolation structure;

forming an initial bulk layer in the source/drain opening, wherein a top surface of the initial bulk layer and a sidewall surface of the bulk layer adjacent to the isolation structure are exposed, and the initial bulk layer has an angled surface formed by the top surface of the initial bulk layer and the sidewall surface of the bulk layer adjacent to the isolation structure;

performing a reshaping process on the initial bulk layer to form a bulk layer having an exposed flat reshaped surface, the exposed flat reshaped surface connecting the gate structure and the isolation structure, wherein the reshaping process converts the angled surface of the initial bulk layer to the exposed flat reshaped surface of the bulk layer, and an intersection line between the exposed flat reshaped surface and a sidewall of the isolation structure is higher than an intersection line between the angled surface and the sidewall of the isolation structure; and after performing the reshaping process, forming a protective layer on the bulk layer, wherein the protective layer has a uniform thickness.

2. The method according to claim 1, wherein:
the semiconductor substrate is made of silicon; and
the isolation structure is made of silicon oxide.

3. The method according to claim 2, wherein forming the source/drain openings comprises:
etching the semiconductor substrate at two sides of the gate structure to form initial source/drain openings in the semiconductor substrate using the gate structure, the dummy gate structure and the isolation structure as an etching mask, wherein a sidewall surface of the initial source/drain opening is perpendicular to a bottom of the initial source/drain opening; and
removing portions of the semiconductor substrate on the sidewall surfaces of the initial source/drain openings and the bottoms of the source/drain openings to form the source/drain openings.

4. The method according to claim 1, wherein:
the semiconductor structure includes a PMOS transistor;
the initial bulk layer is made of silicon germanium; and
the initial bulk layer is formed by an epaxial growth process.

5. The method according to claim 4, wherein:
a crystal orientation of the top surface of the initial bulk layer is <100>.

6. The method according to claim 4, wherein:
a crystal orientation of the sidewall surface of the initial bulk layer is <111>.

7. The method according to claim 1, wherein:
the reshaping process includes a high temperature baking process;
a carrier gas of the high temperature baking process includes one of hydrogen gas and nitrogen gas;
a temperature of the high temperature baking process is in a range of approximately 780° C-820° C.; and
a time of the high temperature baking process is in a range of approximately 15 seconds-60 seconds.

8. The method according to claim 1, wherein:
the protective layer is made of boron doped silicon; and
the protective layer is formed by an epitaxial growth process.

9. The method according to claim 1, wherein:
a thickness of the protective layer is in a range of approximately 10 nm-20 nm.

10. The method according to claim 9, wherein:
the semiconductor substrate includes a third region;
the second region is located between the third region and the first region; and
the third region is used to form one of a PMOS transistor and an NMOS transistor.

11. The method according to claim 1, after forming the source/drain openings and before forming the initial bulk layer, further comprising:
forming a seed layer in the source/drain openings, wherein the seed layer is made of silicon germanium.

12. The method according to claim 1, after forming the protective layer, further comprising:
forming a dielectric layer on the semiconductor substrate, top and sidewall surfaces of the gate structure, top and sidewall surfaces of the dummy gate structure and a top surface of the protective layer;
removing portions of the dielectric layer until the protective layer is exposed to form contact holes;
forming a metal silicide layer on the protective layer exposed by the connect holes; and
forming a conductive plug on the silicide layer and in each of the contact holes.

13. The method according to claim 1, wherein:
the exposed flat reshaped surface of the bulk layer extends from the gate structure to the isolation structure.

14. The method according to claim 1, wherein:
the protective layer is flat.

15. The method according to claim 1, wherein:
the apex angle is formed between two portions of the sidewall surface of the source/drain opening.

16. The method according to claim 1, wherein:
the protective layer covers completely the exposed flat reshaped surface of the bulk layer.

* * * * *